United States Patent
Ayala et al.

(10) Patent No.: US 6,828,797 B2
(45) Date of Patent: Dec. 7, 2004

(54) ALTERNATIVE METHOD FOR VOD TESTING OF LINEAR DIFFERENTIAL LINE DRIVERS

(75) Inventors: Ricardo Ayala, Sherman, TX (US); Samuel A. Rizzo, Sr., Pottsboro, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 10/138,541

(22) Filed: May 3, 2002

(65) Prior Publication Data

US 2003/0112014 A1 Jun. 19, 2003

Related U.S. Application Data

(60) Provisional application No. 60/342,139, filed on Dec. 19, 2001.

(51) Int. Cl.[7] ...................... G01R 31/08; H03K 19/175
(52) U.S. Cl. .......................................... 324/522; 326/86
(58) Field of Search ................................. 324/522, 647, 324/705; 326/86, 87, 89; 327/108; 330/253

(56) References Cited

U.S. PATENT DOCUMENTS 6,320,406 B1 * 11/2001 Morgan et al. ............... 326/14

* cited by examiner

Primary Examiner—Guy J. Lamarre
Assistant Examiner—James C. Kerveros
(74) Attorney, Agent, or Firm—J. Dennis Moore; W. James Brady, III; Frederick J. Telecky, Jr.

(57) ABSTRACT

A method for measuring a test differential voltage across a first output and a second output of a transmitter integrated circuit device, the test differential voltage corresponding to a voltage across the first output and second output appearing while the device is providing an output while being subjected to a voltages applied across a resistor network connected to the differential outputs, the resistor network including first resistor having a value of Ra connected between the first output and a first voltage, a second resistor having a value of Rb connected between the second output and a second voltage, and a third resistor having a value of Rc connected between the first output and the second output. In the method, a first current is applied to the first output, the first current being of a magnitude determined to correspond to a magnitude of current that would appear at the first output while the device were providing an output while being subjected to said predetermined voltages applied across said resistor network. A second current is applied to the first output, the second current being of a magnitude determined to correspond to a magnitude of current that would appear at the second output while the device were providing an output while being subjected to said predetermined voltages applied across said resistor network. Finally, a test differential output voltage is measured across the first output and the second output.

1 Claim, 3 Drawing Sheets

ALTERNATIVE METHOD FOR VOD TESTING OF LINEAR DIFFERENTIAL LINE DRIVERS

This application claims priority under 35 USC § 119(e)(1) of provisional application Ser. No. 60/342,139, filed Dec. 19, 2001.

TECHNICAL FIELD OF THE INVENTION

This invention relates to methods for testing linear differential line drivers, and more particularly relates to testing linear output differential voltage parameters.

BACKGROUND OF THE INVENTION

A widely used technology for interconnecting devices on a network is EIA-485, also known as RS-485. The names for this technology reflect the fact that it is compliant with the TIA/EIA-485-A standard (hereinafter, "the EIA-485 standard"), described in "Electrical Characteristics of Generators and Receivers for use in Balanced Digital Multipoint Systems," March 1998, available from the Telecommunications Industry Association. The EIA-485 standard specifies the characteristics of the generators, or transmitters, and receivers used in a digital multipoint system. A digital multipoint system is one in which two or more transmitters and one or more receivers are connected by way of a single bus. The standard describes such parameters as unit loads, output drive, short circuit current and common mode voltage. The standard does not specify other qualities of the system such as signal quality, protocol, timing pin assignments, power supply voltages or operating temperature range. Basically, according to the standard, a driver must be able to source at least 1.5 volts differentially into 60 ohms (two 120 ohm terminators in parallel along with 32 unit loads) under a common mode voltage range of −7 to +12 direct current volts, Vdc.

An EIA-485 bus is a balanced transmission line that has two wires, other than ground, typically twisted pair, identified as A and B. The transmission line is considered balanced, because the signal on one wire is ideally the exact opposite of the signal on the other wire, i.e., a driver generates complementary voltages on A and B. Thus, if one wire is transmitting a High the other wire will be transmitting a Low, and vice versa.

In EIA-485 systems, drivers are typically implemented using bi-directional transceiver packages, such as the SN65176B and SN75176B Differential Bus Transceiver integrated circuits manufactured by Texas Instruments Incorporated. It is necessary for the manufacturer of such transceiver packages to test the Output Differential Voltage, VOD, on the drivers. Such tests have been typically performed using resistive components on specialized test boards made up to fit on the tester machines used in the fab for testing packages that come off the line. However, passing components through these test boards limits manufacturing line throughput, as the test boards take time to install. In addition, such test boards are expensive to fabricate, and are usually specific to only one product or class of products, adding to the overall cost of manufacture. It would therefore be desirable to have a method for testing linear differential devices, such as EIA-485 transceiver ICs, that is less costly and time consuming.

SUMMARY OF THE INVENTION

In accordance with the present invention there is provided a method for measuring a test differential voltage across a first output and a second output of a transmitter integrated circuit device, the test differential voltage corresponding to a voltage across the first output and second output appearing while the device is providing an output while being subjected to a voltages applied across a resistor network connected to the differential outputs, the resistor network comprising a first resistor having a value of Ra connected between the first output and a first voltage, a second resistor having a value of Rb connected between the second output and a second voltage, and a third resistor having a value of Rc connected between the first output and the second output. In the method, a first current is applied to the first output, the first current being of a magnitude determined to correspond to a magnitude of current that would appear at the first output while the device were providing an output while being subjected to said predetermined voltages applied across said resistor network. A second current is applied to the first output, the second current being of a magnitude determined to correspond to a magnitude of current that would appear at the second output while the device were providing an output while being subjected to said predetermined voltages applied across said resistor network. Finally, a test differential output voltage is measured across the first output and the second output.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Before discussing the preferred embodiments, it is important to understand certain terms used in the description. The definitions of these terms are now given, with the description of the preferred embodiments following such definitions. In the following discussion an input voltage Vin can be either a high voltage input Hin or a low voltage input Lin.

1. Definitions.

Figure 1A:
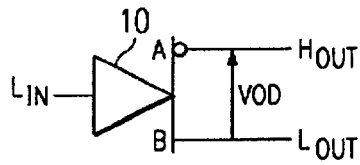
FIG. 1(a) is a representation of an EIA-485 driver showing VOD for a low input condition.
Figure 1B:
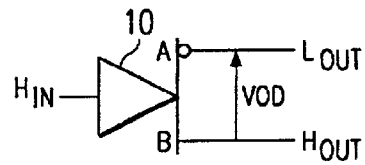
FIG. 1(b) is a representation of an EIA-485 driver showing VOD for a high input condition.

Output Differential Voltage, or VOD: The voltage difference between two outputs of a driver not with respect to common ground, as depicted in FIGS. 1($a$) and 1($b$). In FIG. 1($a$) driver 10 receives a low input Lin and drives line A to a high output, Hout, and drives line B to a low output, Lout. In FIG. 1($b$) driver 10 receives a high input Hin and drives line A to a low output, Lout, and drives line B to a high output Hout. In both cases the difference between the output on line A and on line B is VOD, as shown. VOD is measured for all possible input combinations. For example, if a single driver is under test, VOD is measured with the input at a high level, as shown in FIG. 1($b$), and then at a low level, as shown in FIG. 1($a$).

VOD1: An open-circuit VOD measurement with a force current of 0ua applied to each output.

Figure 4A:
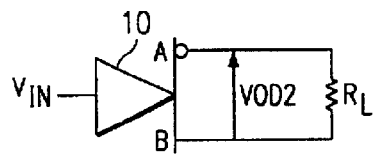
FIG. 4(a) is a representation of an EIA-485 driver showing a VOD2 measurement.
Figure 4B:
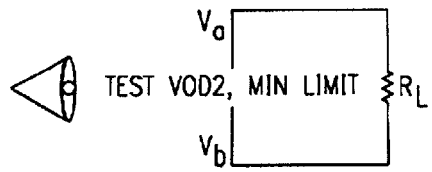
FIG. 4(b) illustrates what the driver of FIG. 4(a) "sees" electrically.

VOD2: A VOD measurement with a single resistive load $R_L$ between the two outputs of a single device, with no ground present, as shown in FIG. 4($a$). The load resistor may be either 54 or 100 ohms, which depends on the device specification.

Figure 3:
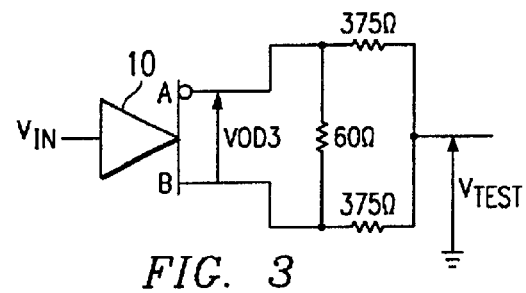
FIG. 3 is a representation of an EIA-485 driver showing $V_{TEST}$ in a configuration having a resistive network tied between the outputs of the driver.

VOD3: A VOD measurement with a resistive network tied between the two outputs of a single device. See FIG. 3, for an example.

Delta |VOD|: The absolute magnitude of the difference between the differential output levels with the state of the input at a low and then high level.

Figure 2:
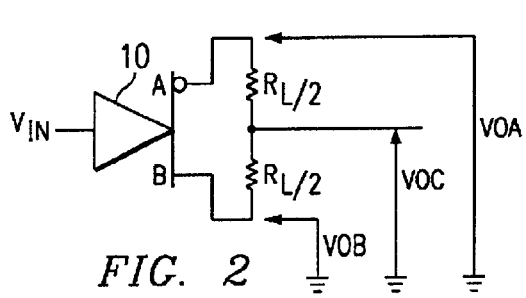
FIG. 2 is a representation of an EIA-485 driver showing VOA, VOB and VOC voltages.

VOA: The voltage on output node A with respect to ground, as shown in FIG. 2.

VOB: The voltage on output node B with respect to ground, as shown in FIG. 2.

VOC: Common mode output voltage with respect to ground, as shown in FIG. 2.

Delta |VOC|: The absolute magnitude of the difference between the complementary common mode output levels. This is also found to be the arithmetic average of the complementary output voltages, or |((VOA−VOB)/2)+VOB|, where VOH: Output high voltage level with respect to ground at a specified IOH.

VOL: Output low voltage level with respect to ground at a specified IOL.

2. Description.

The use of the inventive method can eliminate the need for cumbersome tester load boards, and it can also eliminate the need for the extra components associated with such boards. The elimination of these boards improves the testability, yield and throughput on device testers. The method can be implemented at both probe and final test.

VOD, as defined above, is the differential voltage measurement of two outputs of one driver. VOD is a critical factor for linear applications therefore three different tests are conducted to ensure that a device under test will function under different loads.

The VOD1 test requires a force current of 0ua at both output levels, high and low. Due to this requirement, VOD1 is simply a standard VOH and VOL test. Since this parameter is a differential measurement we must first measure VOH and VOL $$VOD1=VOH_{(0ua)}-VOL_{(0ua)}$$

and then take the difference between them. Therefore VOD1 of one driver is calculated as It is the tests for VOD2 and VOD3 which require an external resistor bridge that has given rise to the prior art requirement for a special tester load board with the specified resistors mounted on the board, with the appropriate sockets required for mating with the device and the given tester, and the associated electrical interconnections, whether by wiring or printed circuit board wiring layers, or both. Referring now to FIGS. 5($a$) and 5($b$), a device under test 12 is shown connected for a VOD3 test. FIG. 5($a$) is a diagram of the device under test for VOD3, at a high VOD3 measurement of 5 volts. FIG. 5($b$) is a diagram of the device under test for VOD3, at a low VOD3 measurement of 1.5 volts. Resistors Ra, Rb and Rc comprise the external resistor network that is specified by the EIA-485 standard in a VOD3 test. Many existing testers in use on IC lines do not have the internal configurability to provide such resistors, and therefore a special tester load board must be constructed with these resistors placed on the board. Measurements are taken at nodes A and B. This load board must have the appropriate sockets and form factors to receive the device and interface with the tester and the loader, while providing the resistor bridge as the appropriate load and making nodes A and B available to the tester for the actual test.

The method of the present invention eliminates the need for such special tester load boards, as will now be described. The method provides a simulation of the electrical circuit that the device under test "sees" in the prior art special tester load boards described above, while allowing the test to be done with conventional testers that would otherwise require such special tester boards.

As mentioned above, VOD2 is an actual differential voltage measurement where ground is absent. The measurement is the difference between the inverting and non-inverting outputs on one driver of the device, as shown in FIG. 4($a$). It is usually performed with one or two alternate load resistances, 54 and 100 ohms. As shown in FIG. 4($b$), the device sees a resistive path from output A to output B. Therefore, given a resistive load $R_L$ and a minimum voltage drop requirement, determined by the EIA-485 standard, the needed currents are calculated to simulate the load resistance.

ISS is the current flowing out from the high voltage level output through the resistance $R_L$ and into the low voltage level output. Therefore ISS=VOD2 (drop between outputs)/$R_L$. Since the EIA-485 standard specifies a minimum voltage requirement for VOD2 of 2 volts and an $R_L$ of 100 ohms, ISS is calculated using $$ISS=VOD2_{min/RL}$$

With ISS thus determined, according to the inventive method VOH and VOL can now be measured using ISS as the force condition.

$$VOD2=VOH_{ISS}-VOL_{ISS}$$

In other words, in accordance with the inventive method, the tester is set to force ISS, as provided above, the resultant VOH and VOL are measured, and VOD2 calculated as specified above.

Figure 6A:
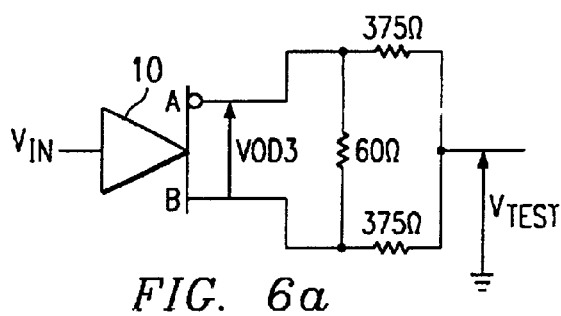
FIG. 6(a) is a representation of an EIA-485 driver showing a VOD3 measurement.
Figure 6B:
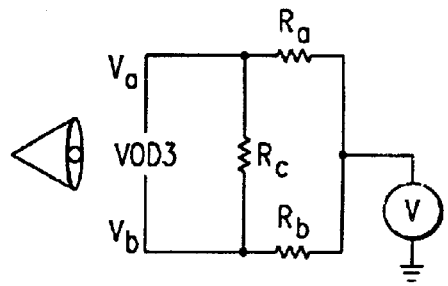
FIG. 6(b) illustrates what the driver of FIG. 5(a) "sees" electrically.

VOD3 is another real differential voltage measurement where ground is absent. As before, the measurement is taken between the inverting and non-inverting outputs on one driver of the device. This test is performed with a resistive network and an outside voltage source between the A and B outputs, as shown in FIG. 6(a). FIG. 6(b) shows what the device "sees."

Figure 7:
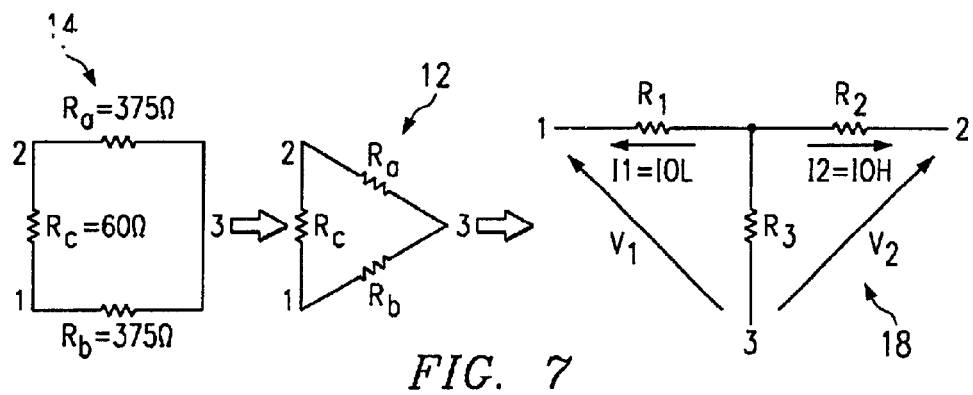
FIG. 7 illustrates the steps in a transformation of a resistive network to a Delta network to a Wye network.

Using Thevenin's theory for resistive networks, a VOD3 resistive network such as shown in FIG. 6(a) can be simplified to a Delta network, as shown in FIG. 7. Further simplification on this network allows the transformation from a Delta to Wye network, as shown in FIG. 7. In the example shown in FIG. 7, a network of resistors Ra=375 Ω, Rb=375 Ω and Rc=60 Ω, is used. For the corresponding Wye network a current of I1=IOL flows through R1, and a current of I2=IOH flows through R2. A voltage drop of V1 exists across R1/R2, while a voltage drop of V2 exists across R3/R2.

The values of the WYE resistors are calculated from the value of the resistors in the Delta network. From page 117-119 of "Basic Circuit Theory with Digital Computations", for example, the following expressions may be used for this purpose:

$$R_2 = (R_c * R_a)/(R_a + R_b + R_c)$$

$$R_1 = (R_c * R_b)/(R_a + R_b + R_c)$$

$$R_3 = (R_a * R_b)/(R_a + R_b + R_c)$$

Once the resistor values of the WYE network are known, the above-mentioned voltage drops are applied to the nodes, as shown in FIG. 7. The voltage on node 1 is either VOH or VOL, the voltage on node 2 is, again, either VOH or VOL, and voltage on node 3 will be $V_{TEST}$ as specified in the EIA-485 standard. Now, V1, the voltage between node 3 and node 1, equals to the voltage of node 3 minus the voltage of node 1:

$$V_1 = V_{(node\ 3)} - V_{(node\ 1)}$$

and V2, the voltage between node 3 and node 2, equals to the voltage of node 3 minus the voltage node 2

$$V_2 = V_{(node\ 3)} - V_{(node\ 2)}$$

For a first preferred embodiment of the method of the invention, the node 3 to node 1 current path is used as the IOL, and the node 3 to node 2 current path is used as the IOH. Matrix algebraic calculations are then applied to determine the expressions for determining IOL and IOH. Again, from "Basic Circuit Theory with Digital Computations", page 64, we apply the following expressions for IOH and $$IOL = [1/(R_1+R_3)(R_3+R_2)-(R_3*R_3)] * [(R_3+R_2)*(V_1)-(R_3)*(V_2)]_{VOL}$$

$$IOH = [1/(R_1+R_3)(R_3+R_2)-(R_3*R_3)] * [(R_3+R_1)*(V_2)-(R_3)*(V_1)]$$

In the above paragraphs, all the variables for determining VOD3 in accordance with the first embodiment of the method of the invention have been presented. How these variables are used in the application of the inventive test method to determine VOH and VOL will now be described.

Figure 8A:
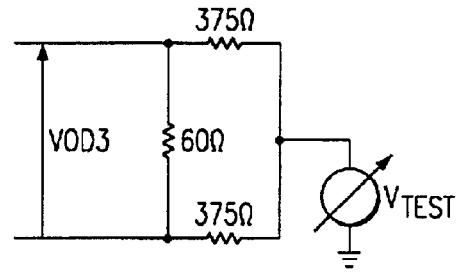
FIG. 8(a) illustrates a specific example of a VOD3 test.
Figure 8B:
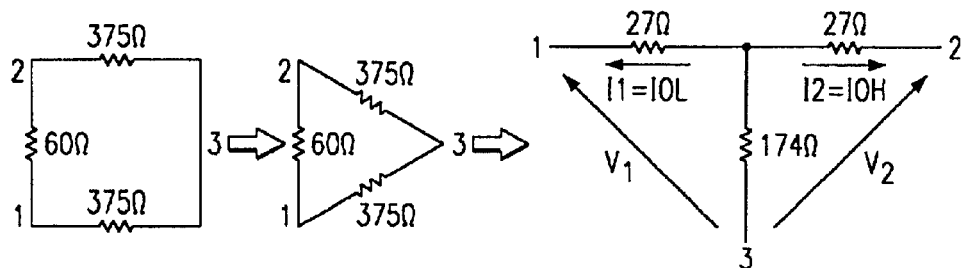
FIG. 8(b) illustrates the steps in the transformation of the resistive network of FIG. 7(a) to a Delta network to a Wye network.

VOD3 is the differential voltage drop across Rc, the 60 ohms resistor in FIG. 7. The requirement in the EIA-485 standard is that this voltage drop should not be greater then 5 volts and not less then 1.5 volts. FIG. 8(a) shows a VOD3 measurement for the resistive network of FIG. 7, where $V_{TEST}$ is an input voltage source. In order to obtain values for different conditions according to the inventive method, the IOL and IOH expressions set forth above are used. But before those expressions are used, the following transformations are applied, taken from standard network to Thevenin's theory to Delta to a WYE resistor network, as depicted in FIG. 8(b). After the network transformation, the resistor values are determined to be:

$$R_1 = (R_c*R_b)/(R_a+R_b+R_c) = (60*375)/(375+375+60) = 27.8 \text{ ohms}$$

$$R_2 = (R_c*R_a)/(R_a+R_1+R_c) = (60*375)/(375+375+60) = 27.8 \text{ ohms}$$

$$R_3 = (R_a*R_b)/(R_a+R_b+R_c) = (375*375)/(375+375+60) = 174 \text{ ohms}$$

Given the above resistor values for R1, R2 and R3, Table 1, below, can be used to show the different VOD3 voltage drops across Rc as the IOL and IOH changes due to possible process shifts. In this example, applying the inventive method, the VOH and the VOL levels are applied and varied to observe the current and VOD3 changes, where $V_{TEST}$ is equal to +12 v or −7 v, and:

$$V_1 = V_{test} - VOL$$

$$V_2 = V_{test} - VOH$$

$$IOL[1/(R_1+R_3)(R_3+R_2)-(R_3*R_3)] * [(R_3+R_2)*(V_1)-(R_3)*(V_2)]$$

$$IOH = [1/(R_1+R_3)(R_3+R_2)-(R_3*R_3)] * [(R_3+R_1)*(V_2)-(R_3)*(V_1)]$$

$$VOD3 = VOH - VOL$$

$$I_{VOD} = VOD3/60 \text{ ohms}$$

$$I_{test} = IOL + IOH$$

TABLE 1

| VOL | Vtest>> VOH | 12 V1 | V2 | IOL | IOH | Itest | VOD | Ivod |
|---|---|---|---|---|---|---|---|---|
| 0 | 5 | 12 | 7 | 114.6E−3 | −64.0E−3 | 50.5E−3 | 5 | 83.3E−3 |
| 0.5 | 5 | 11.5 | 7 | 105.0E−3 | −55.8E−3 | 49.2E−3 | 4.5 | 75.0E−3 |
| 0.5 | 4 | 11.5 | 8 | 88.4E−3 | −36.6E−3 | 51.9E−3 | 3.5 | 58.3E−3 |
| 1 | 4.3 | 11 | 7.7 | 83.8E−3 | −34.1E−3 | 49.7E−3 | 3.3 | 55.0E−3 |
| 1 | 4 | 11 | 8 | 78.8E−3 | −28.3E−3 | 50.5E−3 | 3 | 50.0E−3 |
| 1.1 | 4 | 10.9 | 8 | 76.9E−3 | −26.7E−3 | 50.3E−3 | 2.9 | 48.3E−3 |
| 1.1 | 3.5 | 10.9 | 8.5 | 68.7E−3 | −17.1E−3 | 51.6E−3 | 2.4 | 40.0E−3 |
| 1.2 | 3.5 | 10.8 | 8.5 | 66.7E−3 | −15.4E−3 | 51.3E−3 | 2.3 | 38.3E−3 |
| 1.2 | 3 | 10.8 | 9 | 58.5E−3 | −5.8E−3 | 52.7E−3 | 1.8 | 30.0E−3 |
| 1.3 | 3 | 10.7 | 9 | 56.6E−3 | −4.2E−3 | 52.4E−3 | 1.7 | 28.3E−3 |
| 1.3 | 2.8 | 10.7 | 9.2 | 53.2E−3 | −322.9E−6 | 52.9E−3 | 1.5 | 25.0E−3 |

TABLE 1-continued

| VOL | Vtest>> VOH | −7 V1 | V2 | IOL | IOH | Itest | VOD | Ivod |
|---|---|---|---|---|---|---|---|---|
| 0 | 5 | −7 | −12 | 64.0E−3 | −114.6E−3 | −50.5E−3 | 5 | 83.3E−3 |
| 0.5 | 5 | −7.5 | −12 | 54.4E−3 | −106.3E−3 | −51.9E−3 | 4.5 | 75.0E−3 |
| 0.5 | 4 | −7.5 | −11 | 37.9E−3 | −87.1E−3 | −49.2E−3 | 3.5 | 58.3E−3 |
| 1 | 4.4 | −8 | −11.4 | 34.9E−3 | −86.5E−3 | −51.6E−3 | 3.4 | 56.7E−3 |
| 1 | 4 | −8 | −11 | 28.3E−3 | −78.8E−3 | −50.5E−3 | 3 | 50.0E−3 |
| 1.1 | 4 | −8.1 | −11 | 26.4E−3 | −77.2E−3 | −50.8E−3 | 2.9 | 48.3E−3 |
| 1.1 | 3.6 | −8.1 | −10.6 | 19.8E−3 | −69.5E−3 | −49.7E−3 | 2.5 | 41.7E−3 |
| 1.1 | 3.5 | −8.1 | −10.5 | 18.1E−3 | −67.6E−3 | −49.5E−3 | 2.4 | 40.0E−3 |
| 1.2 | 3.5 | −8.2 | −10.5 | 16.2E−3 | −65.9E−3 | −49.7E−3 | 2.3 | 38.3E−3 |
| 1.2 | 3 | −8.2 | −10 | 7.9E−3 | −56.3E−3 | −48.4E−3 | 1.8 | 30.0E−3 |
| 1.3 | 3 | −8.3 | −10 | 6.0E−3 | −54.7E−3 | −48.7E−3 | 1.7 | 28.3E−3 |
| 1.3 | 2.8 | −8.3 | −9.81 | 2.7E−3 | −50.9E−3 | −48.1E−3 | 1.5 | 25.0E−3 |

From Table 1, a Datasheet VOD3 maximum requirement of 5 volts IOL is approximately 115 ma and IOH is approximately −64 ma. At the minimum limit for VOD3 specified in the EIA-485 standard, 1.5 volts, IOL is about 53 ma and IOH about −323ua. It appears from these two conditions that in order to maintain the VOD3 requirements the differential driver must be able to either sink or source currents from less than 1 ma to 115 ma. Note that VOD3 must be tested twice, to sink and source the maximum amount of current on each output of the driver.

Figure 5A:
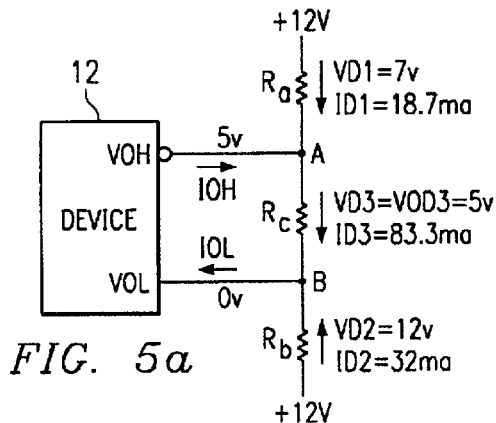
FIG. 5(a) is a diagram of a device under test for VOD3, at a high VOD3 measurement of 5 volts.
Figure 5B:
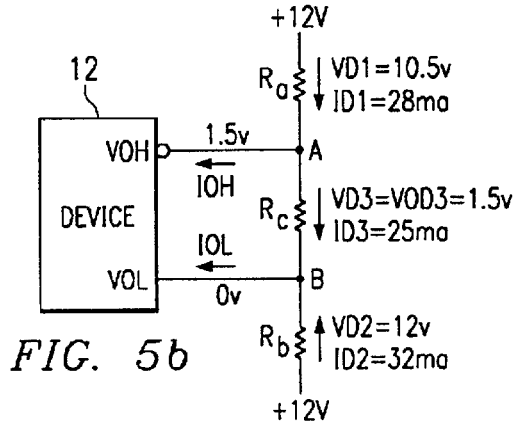
FIG. 5(b) is a diagram of a device under test for VOD3, at a low VOD3 measurement of 1.5 volts.

To further illustrate the relationship of IOL and IOH currents to VOD3 see FIGS. 5(a) and 5(b), which show a device under test for VOH=5 volts, in FIG. 5(a), and a device under test for VOH=1.5 volts, in FIG. 5(b). Current values are obtained as follows, with VD representing the voltage drop:

$$VD = V_{test} - VOH \text{ and } V_{test} - VOL$$

$$IOL = ID_2 + ID_3$$

$$IOH = ID_1 - ID_3$$

The calculated results for FIGS. 5(a) and 5(b) agree with Table 1. Table 1 also illustrates that IOL sinks a greater amount of current when $V_{TEST}$ equals +12 volts, while IOH sources a greater amount of current when $V_{TEST}$ equals −7 volts.

Figure 9:
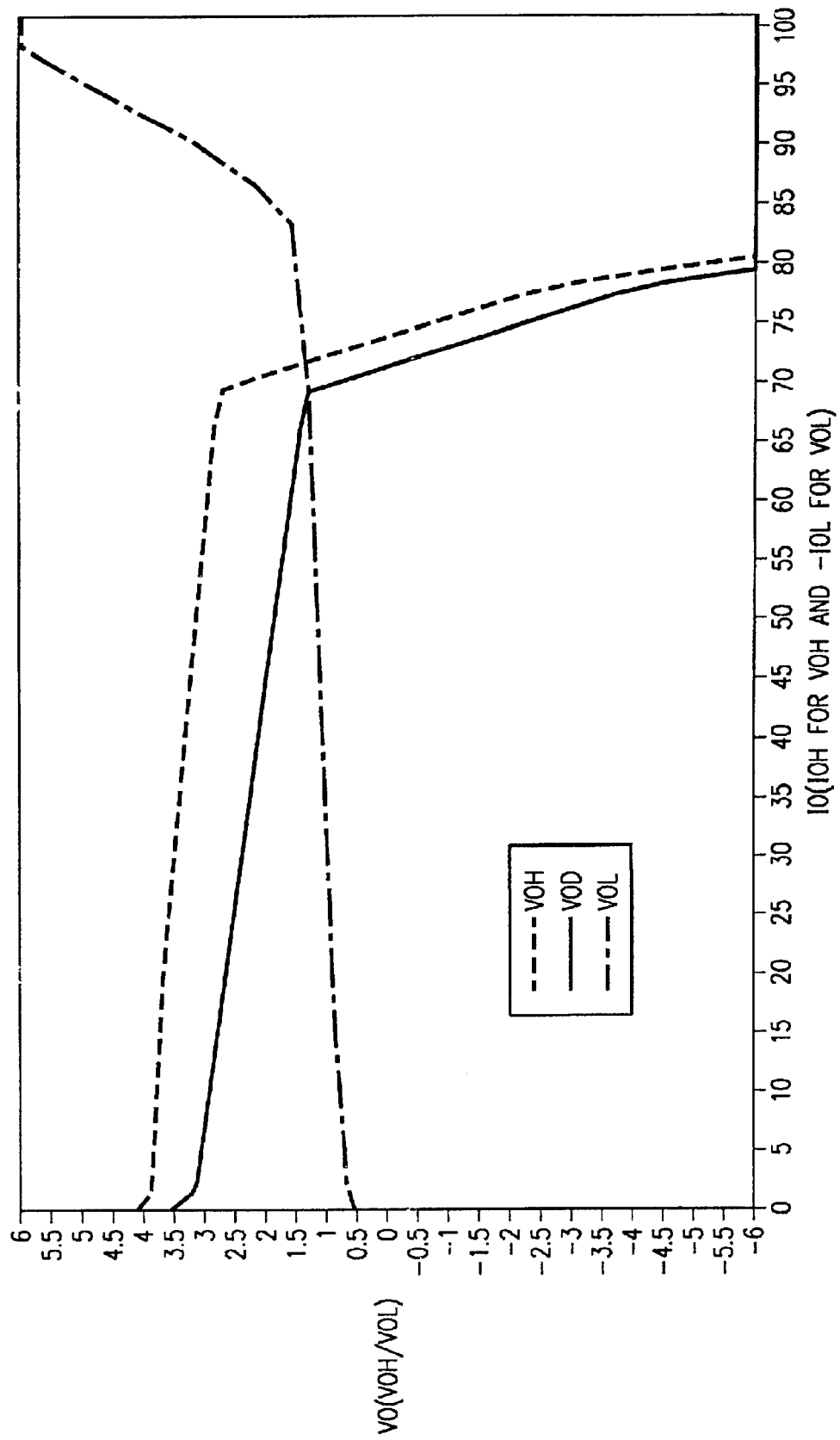
FIG. 9 is a graph of VOH and VOL versus IOL and −IOL, respectively, with the corresponding VOD superimposed, for an exemplary device.

Now that a differential driver has been characterized in terms of the above expressions, the characteristic of a device can be determined using the inventive method by measuring output voltages, VO, for various applied output currents, IO, for both VOH and VOL. FIG. 9 is a graph in which VO is plotted against IO for VOH and VOL, IOH for VOH, and −IOL for VOL, respectively, with the corresponding VOD superimposed, for a representative differential driver. It appears that the maximum VOH of any one output is approximately 4 v and the minimum VOL is no less than about 0.5 volts at 0 $\mu$a forced current. Also, it shows that as current is sunk or sourced the VOH tends to pull down from 4 v and the VOL tends to pull up from 0.5 volts. From these two behaviors, it can be concluded that the device will never reach the maximum VOD3 specification of 5 volts and therefore what is revealed as most significant for test purposes is the minimum specification of 1.5 volts for VOD3.

We have shown that the resistor network required by the VOD3 test is essentially a load on the differential outputs with an outside voltage source of either +12 or −7 volts. This outside voltage source supplies constant current pushing in or pulling out of the device's outputs. This current depends on the device characteristics, but is designed to maintain a voltage drop across the differential outputs. We have also shown that the current from this output voltage source equals IOL+IOH.

$$I_{test} = IOL + IOH$$

As mentioned above, the most important test for VOD is the minimal value of the outputs, 1.5 volts. The graph in FIG. 9 shows that VOD reaches 1.5 volts when IOL and IOH reach about 60 ma. Therefore, it can be said that the worst case VOD3 is as follows, VOD3 (min)=VOH (60 ma)−VOL (60 ma). But this is not a true case because both outputs will not sink or source 60 ma at the same time. It is true that one output will be sinking and the other will be sourcing at the same time, but due to the characteristic of the resistor network one value will be maximum and the other will be minimal. To maintain the specified minimal voltage of 1.5 v across Rc, i.e. the 60 ohms resistor in FIG. 6(a), a current of 25 ma through Rc is needed. As has been shown above, this forces IOL to sink 57 ma while IOH sources −3 ma for a VTEST of +12 v. It also forces IOL to sink 3 ma while IOH sources −57 ma for a VTEST of −7 v. To make the test standard for all 60 ma devices, the following is used to calculate VOD3.

For VTEST of +12 v $$VOD3_1 = VOH_{y(-1ua)} - VOL_{z(60ma)} \text{ at input} = H$$

$$VOD3_2 = VOH_{z(-1ua)} - VOL_{y(60ma)} \text{ at input} = L$$

$$\Delta VOD3 = VOD3_1 - VOD3_2$$

For VTEST of −7 v $$VOD3_2 = VOH_{z(-60ua)} - VOL_{y(0ma)} \text{ at input } L$$

$$\Delta VOD3 = VOD3_1 - VOD3_2$$

$$VOD3_1 = VOH_{y(-60ua)} - VOL_{z(0ma)} \text{ at input} = H$$

The $\Delta VOD3$ must be calculated twice, one for VTEST at +12 v and another for −7 v.

As stated above, VOD2 is the voltage drop across one resistor between the differential outputs. Calculated current through a worst case 54 ohms is 27.7 ma. The following method is used to calculate VOD2.

$$VOD2_1 = VOH_{y(-27.7ma)} - VOL_{z(27.7ma)}$$

$$VOD2_2 = VOH_{z(-27.7ma)} - VOL_{y(27.7ma)}$$

$$\Delta VOD2 = VOD2_1 - VOD2_2$$

Taking advantage of the fact that VOC is defined as one half of VOD2, but with respect to ground, the following method is used to calculate VOC.

$$VOC_1 = (VOD2_1/2) + VOL_{(27.7ma)}$$

$$VOC_2 = (VOD2_2/2) + VOL_{(27.7ma)}$$

$$\Delta VOC = VOC_1 - VOC_2$$

The VOD tests are essentially current driving models to demonstrate the differential outputs' current capability and still maintain a minimum voltage level. These models presented above cover all possible RS232 applications. As each VOD test is done, the output test voltage measurement is made across a resistor on the differential outputs of the device.

We have demonstrated that the VOD test is the differential measurement of the two outputs with one at a VOH level and the other at VOL level. The worst case current supplied into the outputs is during the VOD3 test where an external power supply of −7 v or 12 v is used. The VOH output sources most of the current when the external supply is at −7 v and the VOL output sinks most of the current when the external supply is at 12 v. One output sources or sinks the maximum amount of current while the other output sinks or sources the minimal amount current at the same time. This condition will always exist and therefore the device will never reach its worst type of condition where both outputs sink and source an equal of amount of current.

We have used three methods to show the characteristic of the device as well as the VOD testing. The graph shown in FIG. 9 indicates the device output performance as current is sunk or sourced. This graph can be used as a standard for all differential devices. Table 1, above, is perhaps the clearest indicator of what the outputs are doing as the device shifts due to a process change. In any case, in applying the invention it is apparent that a device will pass the VOD test by using the worst case IOL and IOH to check for a minimum of 1.5 volts.

Although the present invention and its advantages have been described in detail, it should be understood that various changes, substitutions and alterations can be made herein without departing from the spirit and scope of the invention as defined by the appended claims. Thus, for example, the external voltage applied need not be a single voltage applied to both sides of the resistor network, but could be different voltages applied to each side, and various resistor values could be used. In fact, various resistor configurations could be used, and computations adjusted accordingly.

What is claimed is:

1. A method for measuring a test differential voltage across a first output and a second output of a transmitter integrated circuit device, the test differential voltage corresponding to a voltage across the first output and second output appearing while the device is providing an output while being subjected to voltages applied across a resistor network connected to the differential outputs, the resistor network comprising a first resistor having a value of Ra connected between the first cutout and a first voltage, a second resistor having a value of Rb connected between the second output and a second voltage, and a third resistor having a value of Rc connected between the first output and the second output, comprising the steps of:

applying a first current to the first output, the first current being of a magnitude determined to correspond to a magnitude of current that would appear at the first output while the device were providing an output while being subjected to said predetermined voltages applied across said resistor network:

applying a second current to the second output, the second current being of a magnitude determined to correspond to a magnitude of current that would appear at the second output while the device were providing an cutout while being subjected to said predetermined voltages applied across said resistor network: and measuring a test differential output voltage across the first output and the second output, wherein said step of applying a first current is performed by deriving the values of secondary resistors R1, R2 and R3, representing the corresponding resistor values of a Wye network equivalent to the resistor network comprising said first, second and third resistors;

applying said first current having a magnitude of $$IOH = \left[\frac{1}{(R_1 + R_3)(R_3 + R_2) * (R_3 + R_3)}\right] * [(R_3 + R_1) * (V_2) - (R_3) * (V_1)];$$

and wherein said step of applying a second current is performed by applying said second current having a magnitude of $$IOL = \left[\frac{1}{(R_1 + R_3)(R_3 + R_2) * (R_3 + R_3)}\right] * [(R_3 + R_2) * (V_1) - (R_3) * (V_2)].$$

* * * * *